United States Patent [19]

Nishiwaki et al.

[11] Patent Number: 4,560,249

[45] Date of Patent: Dec. 24, 1985

[54] METHOD OF FORMING DIFFRACTION GRATINGS AND OPTICAL BRANCHING FILTER ELEMENTS PRODUCED THEREBY

[75] Inventors: Yoshikazu Nishiwaki; Shunji Matsuoka; Kenji Okamoto, all of Osaka, Japan

[73] Assignee: Sumitomo Electric Industries, Ltd., Osaka, Japan

[21] Appl. No.: 486,171

[22] Filed: Apr. 18, 1983

[30] Foreign Application Priority Data

Apr. 16, 1982 [JP] Japan .................................. 57-63313
Apr. 20, 1982 [JP] Japan .................................. 57-66585
Apr. 30, 1982 [JP] Japan .................................. 57-72713

[51] Int. Cl.$^4$ .............................................. G02B 5/18
[52] U.S. Cl. ................................ 350/162.17; 350/3.7; 350/162.2
[58] Field of Search .................... 350/162.11, 162.17, 350/162.2, 162.22, 3.7

[56] References Cited

U.S. PATENT DOCUMENTS 4,094,575  6/1978  Kellie .............................. 350/162.2
4,208,637  6/1980  Matsuda et al. .................. 350/162.2

Primary Examiner—John K. Corbin
Assistant Examiner—William Propp
Attorney, Agent, or Firm—Sughrue, Mion, Zinn, Macpeak & Seas

[57] ABSTRACT

A method for making a diffraction grating utilizing a laser source, a beam splitter to split the light from the laser source into two light fluxes, a collimator to convert each light flux into a light flux which is parallel and enlarged in diameter, a mirror to irradiate each light flux on a substrate coated with a photoresist, and a photomask on the photoresist. The use of an intermediate mask and focusing leans enables the formation of a diffraction grating within a limited area. A blazed diffraction grating may be formed by splitting a laser beam into two beams having an increased beam radius, and irradiating a light-sensitive material with the resulting two beams to form an interference fringe. This method is characterized in that in a first exposure the two beams are incident on the light sensitive material through air to form an interference fringe having a clearance width of d, and in a second exposure, the two beams are irradiated on the light sensitive material through a symmetrical transparent member having an isosceles triangular cross section in such a manner that the origin coincides to form an interference fringe having a clearance width of d/2, and furthermore, in that the ratio of the first exposure energy to the second exposure energy is made equal to the ratio of the first term to the second term of a Fourier series obtained by expanding the periodical function of the waveform of the blazed diffraction grating.

8 Claims, 33 Drawing Figures (a)  $b_1 \sin kx$ (b)  $b_2 \sin 2kx$ (c) 
$f_2(x)$   $b_1 \sin kx + b_2 \sin 2kx$ U.S. Patent  Dec. 24, 1985  Sheet 3 of 7  4,560,249

U.S. Patent   Dec. 24, 1985   Sheet 4 of 7   4,560,249
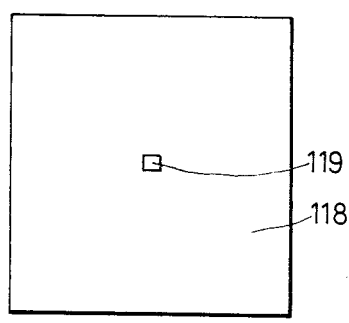
FIG. 11
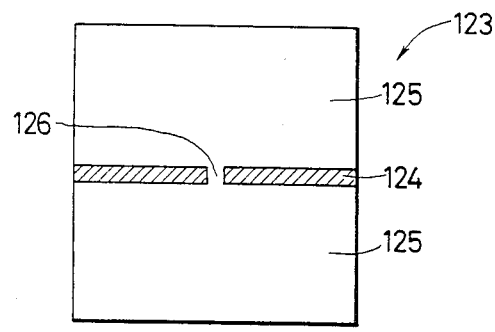
FIG. 12
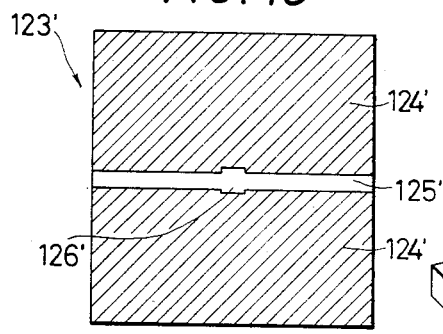
FIG. 13
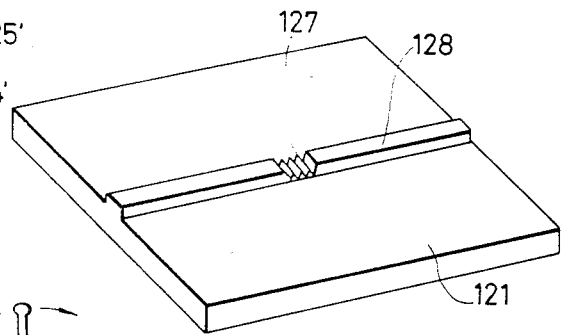
FIG. 14
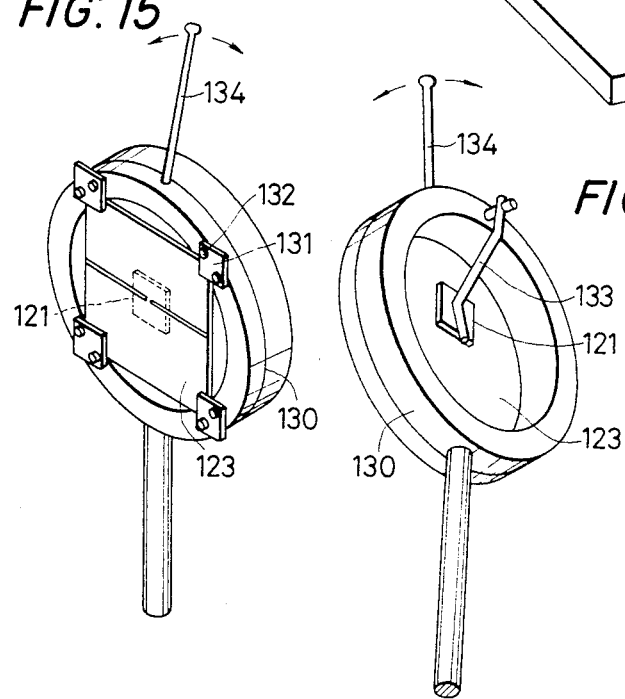
FIG. 15
FIG. 16

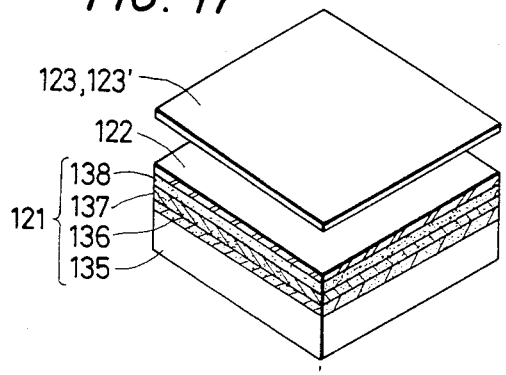
FIG. 17
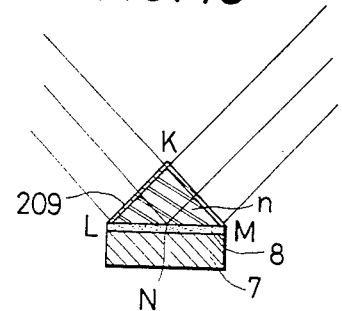
FIG. 18
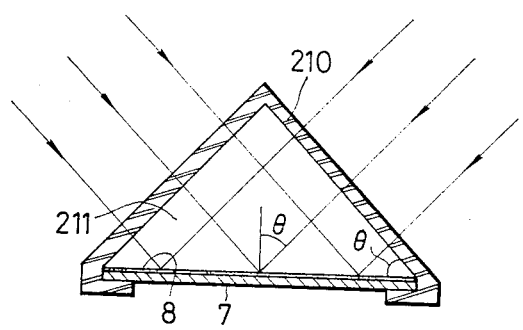
FIG. 20
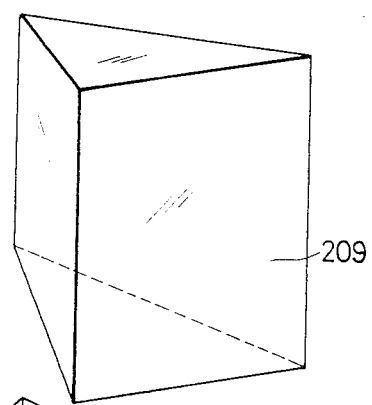
FIG. 19
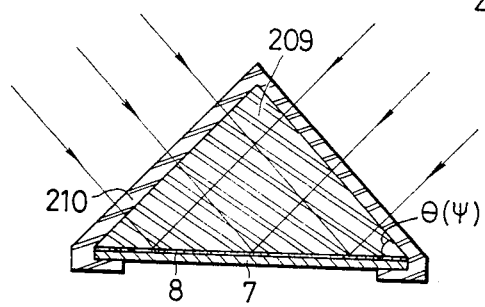
FIG. 21
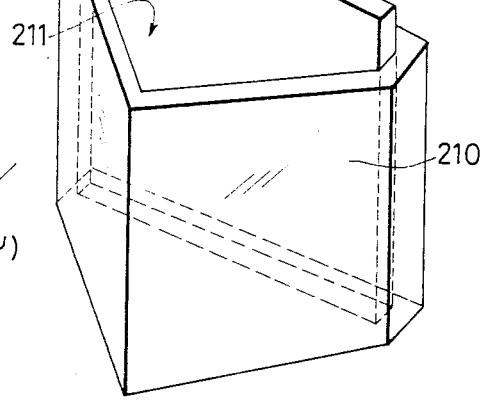

METHOD OF FORMING DIFFRACTION GRATINGS AND OPTICAL BRANCHING FILTER ELEMENTS PRODUCED THEREBY

FIELD OF THE INVENTION

The present invention relates to an exposure method, and more particularly, to an exposure method used in the formation of a localized diffraction grating by the use of a photo mask according to the holographic exposure method and a method for forming blazed diffraction gratings on a photoresist material. The present invention is also directed to optical branching filter elements produced according to the process.

BACKGROUND OF THE INVENTION

An optical integrated circuit comprising a semiconductor substrate, and optical function elements, e.g., a laser source, an optical modulator, an optical detector and an optical branching filter, and optical waveguides integrated on the substrate has been developed as an element for optical communication.

In the optical multiplexer and demultiplexer, distributed feedback laser, etc. of the above-described optical elements, a diffraction grating is utilized. Thus, the production of such optical integrated circuits needs a technique which permits the formation of a diffraction grating at a limited area on the semiconductor substrate.

Photolithography is now used in the production of function elements. Of course, a diffraction grating can be formed by a similar technique.

In forming a diffraction grating on a photoresist, however, there cannot be employed the usual method that comprises placing a photomask having a pattern to be formed, on a substrate and, thereafter, exposing it to light, because it is not possible to form a fine grating pattern in the photomask.

In the formation of such diffraction gratings, therefore, the holographic exposure method has been used.

The schematic diagram of a conventional exposure apparatus which is used to form a diffraction grating according to the holographic exposure method is shown in FIG. 1.

Referring to FIG. 1, a beam of light leaving a laser 1 reaches a beam splitter 2 where it is split into two light fluxes. Each light flux is then converted into a parallel light flux having a greater beam diameter by means of the corresponding collimator 3 or 4. The thus-enlarged light flux is reflected by a mirror 5 or 6 and irradiated on the surface of a semiconductor substrate 7 coated with a photoresist 8.

Since the coherent light from the laser 1 is split into two light fluxes and then incident on the surface of the photoresist 8 at a pre-fixed angle relative to each other, the photoresist 8 is exposed to an exposure energy changing in a sine wave form along the line where a plane containing the two light fluxes and the photoresist surface intersect. Upon appropriate development of the thus-exposed photoresist, a part of the photoresist remains unremoved in a grating form, resulting in the formation of a diffraction grating. The period of the grating can be changed appropriately and optionally by changing the angle at which the light is incident on the photoresist 8.

In accordance with this method, it is possible to expose the photoresist in an interference pattern of 1 $\mu$m or less because there cannot be formed a photomask having a diffraction grating pattern of a submicron cycle.

The conventional two light flux interference method, however, has the disadvantage that since beams having a large diameter are made to interfere, it is possible to form a uniform diffraction grating over a large area, but a diffraction grating of the desired size cannot be formed within a limited area. Thus, in accordance with the conventional holographic exposure method, it is not possible to produce optical integrated circuits having a diffraction grating.

The third method is an electron beam exposure method which utilizes electron beams in the formation of diffraction gratings. Since it is possible to control the trace of electron beam with an accuracy of B 1 $\mu$m, there can be formed a diffraction grating of a submicron period. This method, however, needs a large-sized apparatus, which will lead to an increase in production costs.

Diffraction gratings are widely used in spectrometers, or as optical branching devices for optical communication because of their high wavelength selectivity and resolving power.

These diffraction gratings can be prepared by a mechanical process, or the above described holographic exposure process in which interference fringes due to two beams are formed on a photoresist.

The mechanical process is a method in which a number of equidistant parallel lines are ruled on a substrate by the use of a diamond cutter. These lines can be formed in any desired form. This method, however, has disadvantages in that much complicated labor and long working times are needed because it is necessary to rule from 1,000 to 2,000 lines per millimeter, one by one. Therefore, the production costs are undesirably increased.

In accordance with the holographic exposure process, a diffraction grating is formed by a photographic technique; i.e., a substrate, e.g., glass, coated with a photoresist is irradiated with two coherent beams in such a manner that the beams form a suitable angle relative to each other, and a diffraction grating corresponding to the resulting interference pattern is formed. Upon development of the photoresist, unexposed areas (in the case of negative type photoresists) or exposed areas (in the case of positive type photoresists) are removed, leaving a number of parallel grooves. Vacuum-deposition of a suitable metal, e.g., aluminum, on the grooves provides a diffraction grating of the reflection type, comprising a number of equidistant parallel lines.

This diffraction grating is also called a "holographic grating". The cross section of the diffraction grating is in a sine wave form as illustrated in FIG. 2. In such reflection type diffraction gratings, if the cross section is in a sine wave form, diffraction of high efficiency cannot always be expected. This is because in the case of such sinusoidal gratings, even if light having any wavelength is incident on the grating at any incident angle, there exist an angle of diffraction and an order of diffraction meeting the requirements for Braff diffraction in a broad sense and, therefore, diffracted light is scattered in many directions.

On the other hand, the use of a diffraction grating having a cross section as shown in FIG. 3, i.e., comprising a number of parallel triangular projections having a long slanting surface BA and a short slanting surface AC, increases diffraction efficiency. Diffraction grating having cross sections as shown in FIG. 3 are called "blazed diffraction gratings" because the surface BA is slanted. The angle ($\alpha$) between the normal PR of the grating surface and the normal QR of the slanting surface BA is called a "blaze angle"; i.e., $<ABC=\alpha$.

In the blazed diffraction grating of FIG. 3, the energy of light which is incident normally on the slanting surface AB and diffracted therefrom at the same angle as above is much greater than that of light which is diffracted in a direction corresponding to another order of diffraction. The relation between the wavelength of the light (blaze wavelength), $\lambda_B$, and the blaze angle is represented by the formula:

$$d \sin \alpha = \lambda_B \quad (1)$$

where d is a grating constant.

In addition to a beam of light having the blaze wavelength, there is another beam of light which is diffracted particularly strongly. This beam of light is such that the wavelength and the angle of incidence satisfy the Bragg condition, and the direction of incidence and the direction of diffraction are symmetrical in relation to the normal QR.

In this way, the blazed diffraction grating provides a high diffraction efficiency for a beam of light having a specific wavelength and a specific angle of incidence.

In preparing a diffraction grating according to the holographic exposure method, only one exposure produces a diffraction grating having a cross section of the sine wave form as shown in FIG. 2, whereas when exposure is applied twice, there will be obtained a diffraction grating similar to the blazed diffraction grating.

In general, a periodic function where the period is d can be expanded into a Fourier series.

The cross section of the blazed diffraction grating can be made to correspond to the graph shown in FIG. 4. This is a periodic function and, therefore, can be expanded into a Fourier series as follows:

$$f(x) = \sum_n b_n \sin n k x \quad (2)$$

where $$k = (2\pi)/d. \quad (3)$$

Since $f(x)$ is an odd function in relation to the origin 0, it can be expanded as a sine function.

The coordinates of Point A are determined by a blaze angle, $\alpha$, an angle A, and a period, d. In a case in which the angle A is 90°, for simplicity, the coordinates of Point A are as follows:

$$\left( \frac{d}{2} \cos^2 \alpha, \frac{d}{2} \sin \alpha \cos \alpha \right).$$

Fourier coefficient $b_n$ is determined by the following equation:

$$b_n = \frac{2}{\pi} \int_0^{d/2} f(x) \sin (n k x) \, dx \quad (4)$$

This can be integrated as follows:

$$b_n = \frac{d}{(n\pi)^2} [\tan \alpha + \cot \alpha] \sin (n\pi \cos^2 \alpha) \quad (5)$$

This Fourier coefficient is nearly in reverse proportion to the square of n. Therefore, it converges uniformly at a relatively high speed. In particular, when the terms are n=1 and n=2 are taken and the subsequent terms (n=3, ...) are dropped out, the resulting function is believed to appropriately represent the wave form. Although acute angles A, B, C, ... as shown in FIG. 4 cannot be represented by the terms n32 1 and n=2, the function $$f_2(x) = b_1 \sin kx + b_2 \sin 2 kx \quad (6)$$

appropriately represents the wave form of the blazed diffraction grating.

In FIG. 5, (a) represents $b_2 \sin kx$, (b), $b_2 \sin 2kx$, and (c), ($b_1 \sin kx + b_2 \sin 2kx$). (c) is $f_2(x)$ of the equation (6), and is very similar to the function of the surface of the blazed grating.

Thus, when an interference fringe having a wave number of k and an interference fringe having a wave number of 2k are exposed in a double form with suitable weights (amplitudes) $b_1$ and $b_2$, there can be prepared a diffraction grating similar to the blazed diffraction grating.

This technique has already been proposed and is well known. This technique, however, is difficult to employ. The difficulty is that the origins X=0 of the two functions sin kx and sin 2kx must be in agreement with each other. If the positioning is not complete and, as a result, there is formed a phase gap $\phi$, the resulting function is represented as follows:

$$\phi(x) = b_1 \sin kx + b_2 \sin (2kx + \phi) \quad (7)$$

This function cannot represent the graph as shown in FIG. 5(c).

It is required for the origin X=0 to coincide in both the functions with much higher accuracy than the grating distance d. Since this positioning is very difficult, a method of forming diffraction gratings by double exposure has not yet been put to practical use.

The optical wavelength division multiplex communication system (WDM) transmitting simultaneously a number of light waves having different wavelengths by means of one optical fiber has been extensively studied because of its potentiality for a large amount of communication. An optical branching filter element is a device which is used to take out light having a specific wavelength of a multiple optical signal. Thus, the optical branching filter element is one of the devices which play a significant role in the optical wavelength division multiplex communication system.

Optical branching filter elements which have now been almost put to practical use include a diffraction grating and an interference filter, which are fabricated in a three-dimensional structure.

FIG. 6 shows a cross section of one example of the known diffraction grating type optical branching filter elements. This optical branching element comprises a diffraction grating 31 accommodated in a box type casing 30. When light from an optical fiber 32, containing light having a wavelength $\lambda_1$ and light having a wavelength $\lambda_2$ enters the optical branching filter element, the light having a wavelength $\lambda_1$ and the light having a wavelength $\lambda_2$ are diffracted in different directions by the diffraction grating 31, whereby the light from the optical fiber 32 is branch-filtered. The light having a wavelength $\lambda_1$ and the light having a wavelength $\lambda_2$ can be taken out through light outlet apertures 33 and 34, respectively, which are provided at locations corresponding to the given diffraction angles.

FIG. 7 shows a cross section of one example of the known multi-layer membrane filter type optical branching filter elements. This is a three dimensional optical branching filter element comprising an interference filter 35 accomodated in a box type casing 30. When light from an optical fibre 32 enters the casing 30, it is divided into light having a wavelength $\lambda_1$ and light having a wavelength $\lambda_2$ by the interference filter 35. This multi-layer membrane 35 comprises a number of dielectric thin films having different refractive indexes which are superposed on each other, and lights reflected from the boundary surfaces interfere with each other. The interference filter 35 can reflect almost 100% of light having a specific wavelength and conversely, can transmit almost 100% of light having a specific wavelength.

These conventional optical branching filter elements, however, have disadvantages in that they are in a three dimensional structure and are large sized elements. Thus, small sized elements have been desired.

For this reason, two dimensional wave guide type optical branching filter elements have been proposed. These optical branching filter elements have received increasing attention because of their small size and stability, and have been extensively studied.

FIG. 8 is a perspective view of a known wave guide type optical branching filter element. In a waveguide type optical branching filter element 36, a diffraction grating 39 is formed by ruling periodic lines on a light sensitive material 39 provided on a substrate 37 by a photolithographic technique, for example. A two dimensional wave guide 40 is provided in the structure which extends through the diffraction grating 39, or is bent therein. When a combination of lights having wavelengths $\lambda_1$, $\lambda_2$, and $\lambda_3$ is introduced, only the light having a wavelength $\lambda_2$, satisfying the Bragg condition in relation to the diffraction grating is diffracted, and the remaining lights are allowed to travel straight therethrough. In the wave guide type optical branching filter element, the wave guide and the diffraction grating are on the same plane and in a two dimensional arrangement. Therefore, this type of branching filter element can be reduced in size.

A diffraction grating can be formed in a plane containing a wave guide by techniques such as a holographic exposure method and a light beam scanning method.

As discussed previously with respect to FIG. 1, two beams (a) and (b) form an interference fringe on the surface of the substrate since they are coherent laser beams. The period d of the interference fringe is given by the equation:

$$d = \frac{\lambda}{2 \sin \theta} \tag{8}$$

Upon development of the above exposed light sensitive material, there is formed a diffraction grating having a sinusoidal cross section.

FIG. 9 shows a schematic diagram of an optical system for the light beam scanning method. A laser beam 45 is focused by means of a lens 46 and scanned on the light sensitive material 38 so that it draws parallel grating lines 47. By scanning the laser beam, the parallel grating lines are ruled one by one to form a diffraction grating. The above described holographic exposure two beam interference and light beam scanning methods are known as optical methods of preparing a diffraction grating.

Although the waveguide type optical branching filter element 36 as shown in FIG. 8 can be prepared by the above described optical methods and is a promising element, the wavelength of light to be branch filtered is fixed. Since the period d of the diffraction grating is fixed, a wavelength satisfying the Bragg diffraction condition is previously determined.

It has thus been desired to develop optical branching filter elements which enable one to freely choose the wavelength to be branch filtered. If the wavelength can be freely chosen, it is not necessary to prepare a variety of diffraction gratings depending on wavelengths. Moreover, if the choice of wavelength can be conducted immediately, it is possible to provide the diffraction grating with an optical switching function.

SUMMARY OF THE INVENTION

The object of the invention is to provide an exposure apparatus which enables the formation of a diffraction grating of any desired grating period at any narrow and limited location according to the holographic exposure method.

The present invention relates to an exposure apparatus comprising:

a laser source;

a beam splitter to split the light from the laser source into two light fluxes;

a collimator to convert each of the two light fluxes ito a light flux which is parallel and of enlarged diameter;

a mirror to irradiate each light flux on a substrate coated with a photoresist; and a photomask having a transparent area at a location corresponding to that of the substrate where a diffraction grating is formed, which is to be placed on the substrate carrying thereon a photoresist.

The present invention also relates to a method for forming a diffraction grating by a holographic exposure process in which a laser beam is split into two beams having an increased beam radius, and the two beams are irradiated on a light sensitive material from two symmetrical directions to form thereon an interference fringe, which method is characterized in that at the first exposure the two beams are incident on the light sensitive material through air to form an interference fringe having a clearance width of d, whereas at the second exposure, without changing the angle of each beam and the position of the light sensitive material, a symmetrical transparent member having an isoceles triangular cross section is placed in such a manner that the origin coincides, and the two beams are irradiated through the symmetrical transparent member to form an interference fringe having a clearance width of d/2, and the ratio of the first exposure energy to the second exposure energy is made equal to the ratio of the first term to the second term of a Fourier series obtained by expanding the periodic function of the waveform of the blazed diffraction grating.

It is a further object of the invention to provide optical branching filter elements which make it possible to branch filter a beam of light having any desired wavelength. It has been found that the object can be attained by preparing waveguide type optical branching filter elements using light-sensitive materials having reversibility.

The present invention provides an optical branching filter element comprising a substrate and a waveguide provided on the substrate, said waveguide being prepared from a material capable of reversibly changing its refractive index on irradiation with light and serving to guide light in a plane, so that a diffraction grating is written on or erased from the waveguide by the holographic method or light beam scanning method.

BRIEF DESCRIPTION OF THE DRAWINGS

FIG. 11 is a plan view of an intermediate mask;

FIG. 12 is a plan view of a photomask;

FIG. 13 is a plan view of another photomask;

FIG. 14 is a perspective view of a substrate which has been exposed by the use of an exposure apparatus of the invention;

FIG. 15 is a perspective view of a photomask and substrate mounting device, as seen from the front of the device;

FIG. 16 is a perspective view of the device of FIG. 15, as seen from the back of the device;

FIG. 17 is a partial cross-sectional view of a photomask and a substrate;

FIG. 18 is a partial schematic diagram illustrating the condition that a light sensitive material is exposed to light through a symmetrical transparent member placed in close contact with the top surface of the light sensitive material;

FIG. 19 shows perspective views of a holder to support a substrate and a symmetrical transparent member;

FIG. 20 shows cross sections of a holder and a substrate which are subjected to holographic exposure;

FIG. 21 shows cross sections of a holder, a symmetrical transparent member, and substrate which are subjected to holographic exposure;

DETAILED DESCRIPTION OF THE INVENTION

The present invention will hereinafter be explained in detail by reference to the accompanying drawings.

Figure 10B:
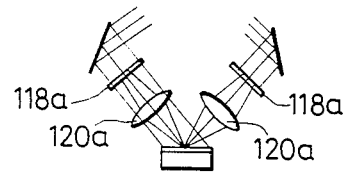
FIG. 10b is a schematic diagram of a modified exposure apparatus of the invention.
Figure 10A:
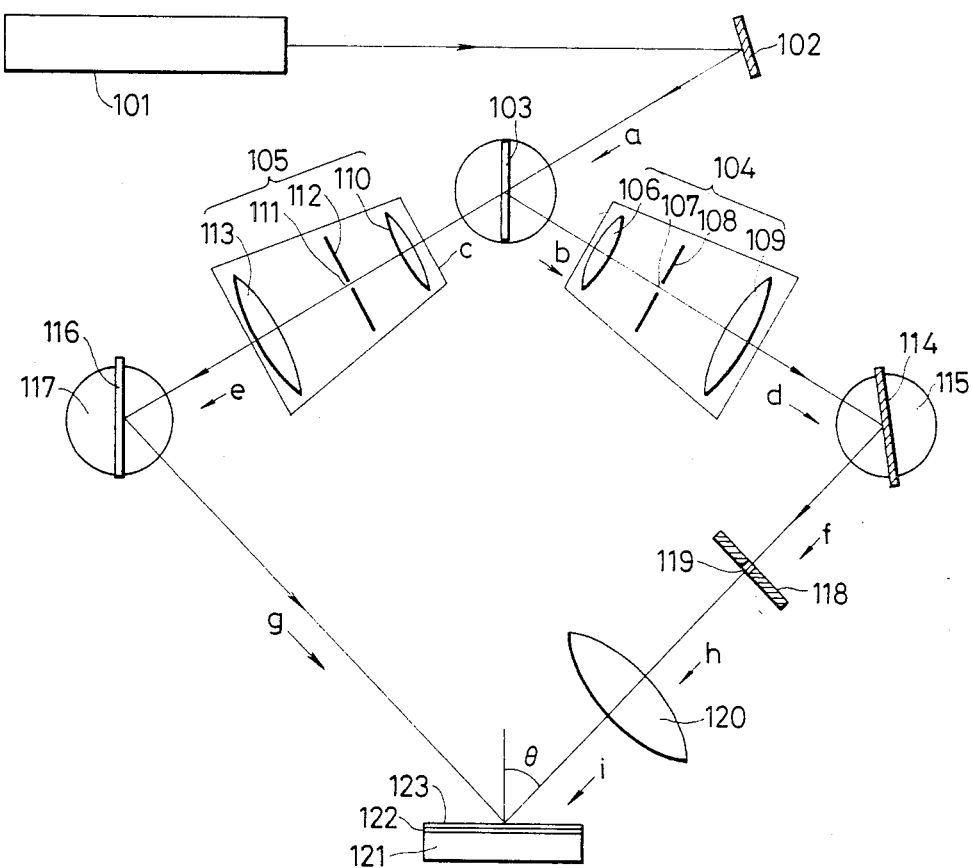
FIG. 10a is a schematic diagram of an exposure apparatus of the invention.

FIG. 10a is a schematic diagram of an exposure apparatus of the invention. Coherent light emitted from a laser 101 is reflected by a mirror 102 and is incident on a beam splitter 103. As the laser 101, for example, a He-Cd laser (wavelength, $\lambda = 4416$ Å) can be used.

The light reflected from the mirror 102, light flux (a), is split into two light fluxes, light fluxes (b) and (c), by the beam splitter 103, and these light fluxes (b) and (c) are sent to collimators 104 and 105, respectively.

The collimator 104 comprises a convex lens 106, a light shielding plate 108 having a pinhole 107, and a convex lens 109, which serves to change light flux (b) which is parallel and of small diameter into light flux (d) which is parallel and of large diameter.

Also, the collimator 105 comprises a convex lens 110, a light shielding plate 112 having a pinhole 111, and a convex lens 113, and changes light flux (c) which is parallel and of small diameter into light flux (e) which is parallel and of large diameter.

Light flux (d) is reflected by a mirror 114. The angle of the mirror 114 can be adjusted appropriately and optionally by controlling a rotary base 115.

Similarly, light flux (e) is reflected by a mirror 116. The angle of the mirror 116 can be adjusted appropriately and optionally by means of a rotary base 117.

The light reflected by the mirror 114, light flux (f), passes through a narrow opening 119 of an intermediate mask 118. The light leaving the opening 119, light flux (h), is then converged by a lens 120, and the thus-converged light, light flux (i) is incident on an object.

This object comprises a semiconductor substrate 121, a photoresist 122 coated on the substrate 121, and a photomask 123 placed in close contact with the photoresist 122. The photomask 123 serves to irradiate only part of light fluxes (g) and (i) on the desired limited area alone. That is, an image coming through the lens 120 from the opening 119 is arranged to appear on the photomask 123, and furthermore, the photomask 123, the photoresist 122, and the substrate 121 are adjusted in position so that the image appears at a light transmitting area of the photomask 123.

FIG. 11 is a plan view of the intermediate mask 118. In this embodiment, the opening 119 at the center of the intermediate mask 118 is a 50×50 μm square.

FIG. 12 is a plan view of the photomask 123. In the photomask 123, a light shielding area 124, i.e., a hatched area, does not allow light to pass therethrough. On the other hand, a transparent area 125 and a central transparent area 126 which are not hatched allow light to pass therethrough. This photomask is used when the photoresist 122 is of positive type. In the case of photoresists of the positive type, areas which are not exposed to light remain after development, whereas areas which are exposed to light are removed by development.

FIG. 13 is a plan view of another photomask 123'. This photomask is used when the photoresist is of negative type. The major portion of the photomask 123' does not allow light to pass therethrough, i.e., constitutes a light shielding area 124'. A transparent area 125' is formed along the central line of the photomask 124', and a central transparent area 126' at the center thereof.

FIG. 14 is a perspective view of a substrate which has been exposed to light by the use of an exposure apparatus of the invention, and thereafter, developed.

An embodiment in which the photomask of FIG. 12 is brought into close contact iwth a positive type photoresist and then exposed to light by the use of an exposure apparatus of the invention will hereinafter be explained in detail.

Referring to FIG. 10a, the entire surface of the photomask 123 placed on the photoresist 122 and the substrate 121 is irradiated with light flux (g). On the other hand, light flux (i) is a limited light flux having the same area as that of the opening 119, and is incident only on the central transparent area 126 of the photomask 123. The light shielding area 124 does not allow light to pass therethrough. Therefore, the photoresist underlying the light shielding area 124 is not exposed to light and, after development, remains on the substrate 121, forming a light wave conductive path 128 shown in FIG. 14. On the other hand, the photoresist underlying the broad transparent area 125 is irradiated with light flux (g), i.e., is entirely exposed to light. The thus exposed photoresist, when developed, is removed, exposing the substrate 121 as shown in FIG. 14.

Light fluxes (g) and (i) are incident on the central transparent area 126 of the photomask 123 at a prefixed angle. Thus, the photoresist underlying the central transparent area 126 is exposed to an exposure energy changing in a sine wave form, and when developed provides a diffraction grating 127 as shown in FIG. 14. In this way, the diffraction grating 127 having the light wave conductive path 128 at both sides thereof is formed on the semiconductor substrate 121. The size and location of the diffraction grating can be adjusted to any suitable ones by controlling the photomask 123 and the intermediate mask 118.

In the same manner, a diffraction grating can be formed by placing the photomask of FIG. 13 on a negative type photoresist. The photoresist underlying the light shielding area 124' of the photoresist 123' is not exposed to light. The photoresist which is not exposed to light is removed by development because it is of negative type. The transparent area 125' is irradiated with light flux (g), and the central transparent area 126' is irradiated with light fluxes (g) and (i), i.e., is subjected to two light flux exposures. Therefore, the photoresist underlying the transparent area 125' remains unremoved, forming the light wave conductive path 128. The photoresist underlying the central transparent area 126' produces the diffraction grating 127. It is preferred that the light wave conductive path 128 is a single mode light wave conductive path, e.g., having a width of 4 μm.

FIG. 15 is a perspective view of a photomask and substrate mounting device as seen from the front thereof, and FIG. 16 is a perspective view of the device of FIG. 15 as seen from the back thereof.

The obverse side of a ring-like holder 130 is provided with tap plates 131 by means of setscrews 132 at four points thereof. The photomask 123 is secured to the holder 130 by means of the tap plates 131, i.e., by driving the setscrews 132. On the other hand, the back side of the holder 130 is provided with a tap arm 133 which is used to secure the semiconductor substrate 121 of the photomask 123. The obverse side of the holder 130 is also provided with a lever 134 which is used to rotate the surface layer of the holder 130 of the two layer structure. In order to form a diffraction grating having a certain angle relative to the light wave conductive path, it is necessary to rotate the substrate in relation ot the light flux for exposure.

Other various devices to mount semiconductor substrates may be used.

FIG. 17 is a partial cross-sectional view of a substrate and a photomask.

The semiconductor substrate 121 with which the photomask 123 is to be brought into close contact is produced by providing a GaAlAS layer 136, a GaAs layer 137, and a GaAlAs layer on a GaAs substrate layer 135 and further, by coating the photoresist 122 on the layer 138.

In the embodiment shown in FIG. 10a, the distance between the lens 120 and the intermediate mask 118 is 2f (wherein f represents the focal distance of the lens), and the distance between the lens 120 and the photoresist 122 is also 2f. In the photoresist 122, therefore, only the area equal to the product of the area of the opening 119 and the reciprocal of cos $\theta$ (wherein $\theta$ represents an incident angle) is irradiated with light flux (i). At this area irradiated with light flux (i), the diffraction grating is formed. The grating cycle is represented by:

$$\lambda/(2 \sin \theta)$$

(wherein $\lambda$ represents the wavelength of laser light).

In this embodiment, a lens of f=50 mm was used.

Although the image of the opening is projected as such on the photoresist in the above embodiment, it may be projected in various ways by changing the position or focal distance of the lens, or enlarging or reducing the size of the opening. This eliminates the production of a variety of intermediate masks.

In the above embodiment, the light wave conductive path 128 connecting to the diffraction grating is formed simultaneously. For this reason, light flux (g) is used to form the light wave conductive path 128. Therefore, it is required for the photomask to be designed so that it shields or transmits light so as to produce the diffraction grating and the optical wave guides. To further define the diffraction grating area from the light wave conductive path, it is necessary to provide the intermediate mask.

The production of only a diffraction grating within a limited area can be achieved by a simple procedure. In this case, the intermediate mask and the lens can be omitted, and it is sufficient to use a photomask alone, that is, a photomask which is transparent at the necessary area (in the case of negative type photoresists) or made to shield light at the necessary area (in the case of positive type photoresists) is placed on the photoresist 122 and the substrate 121.

The use of the exposure apparatus of the invention enables the formation of a diffraction grating of the order of submicron within a limited area.

A modification of the apparatus of FIG 10a is shown in FIG. 10b wherein an intermediate mask 118a and lens 120a is provided in the respective light paths. One of the intermediate masks 118a forms a light wave conductive path and the other mask 118a restricts the area of the diffraction grating.

Figure 1:
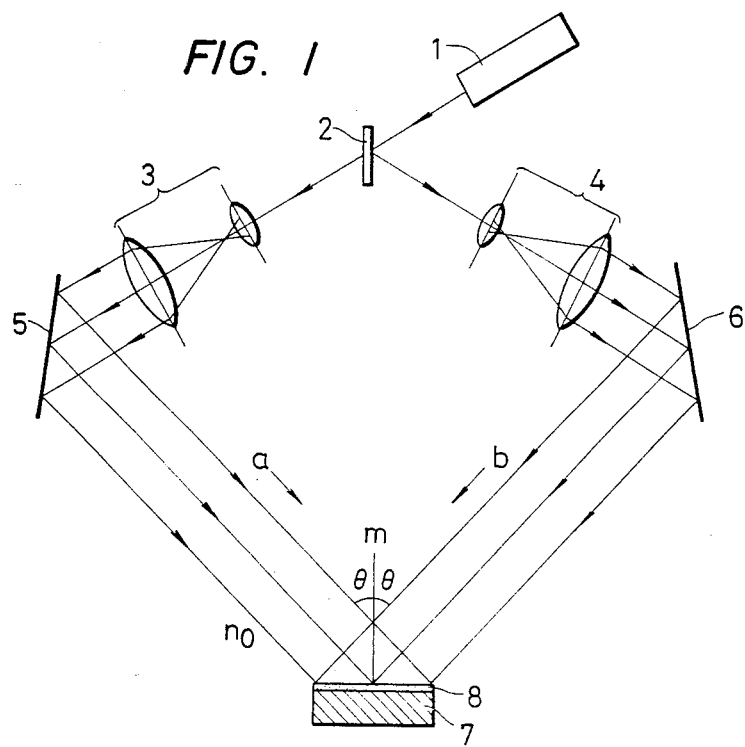
FIG. 1 is a schematic diagram of an optical system for a holographic exposure process to prepared a diffraction grating by irradiating a light sensitive material with two beams of light.
Figure 2:
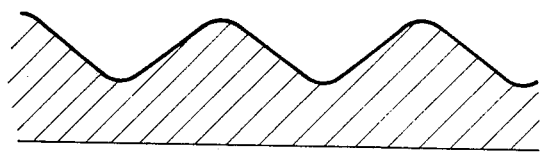
FIG. 2 is a sinusoidal cross section of the conventional holographic diffraction grating prepared by the holographic exposure process.
Figure 3:
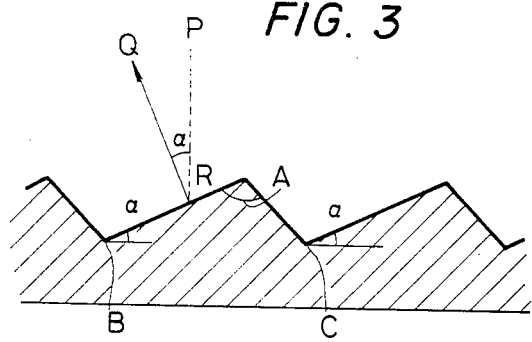
FIG. 3 is a sawtooth-like cross section of the blazed diffraction grating.
Figure 4:
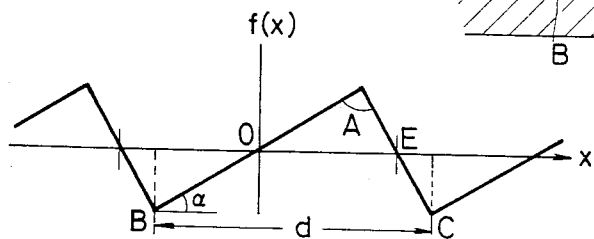
FIG. 4 is a graph showing the cross section of a blazed diffraction grating having a period of d.
Figure 5:
FIG. 5 is a graph showing that a sawtooth-like cross section of the blaze diffraction grating can be synthesized by combining together a sinusoidal function of a wavelength k and a sinusoidal function of a wavelength 2k, wherein (a) is a graph of $b_1 \sin kx$, (b) is a graph of $b_2 \sin 2kx$, and (c) is a graph of $b_1 \sin kx + b_2 \sin 2kx$.
Figure 5:
Figure 5:
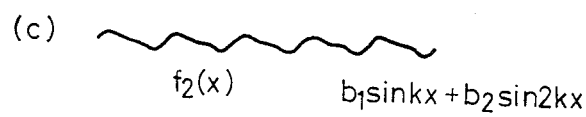
Figure 6:
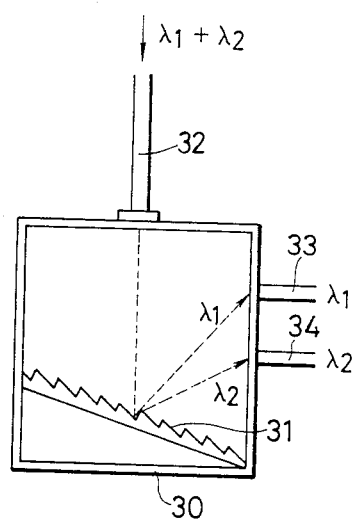
FIG. 6 is a cross sectional view of the known diffraction grating type optical branching filter element.
Figure 7:
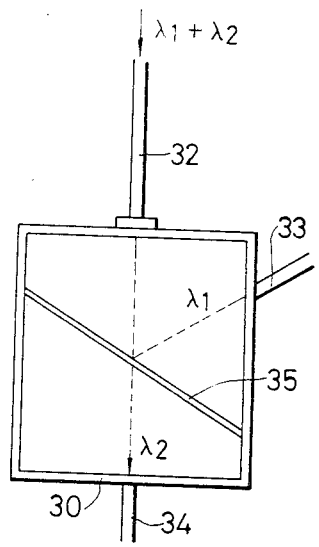
FIG. 7 is a cross sectional view of the known interference filter type optical branching filter element.
Figure 8:
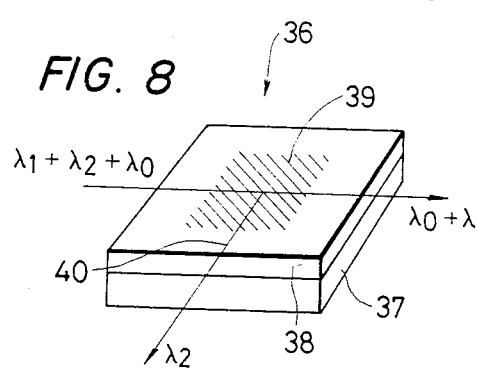
FIG. 8 is a perspective view of the known waveguide type optical branching filter element.
Figure 9:
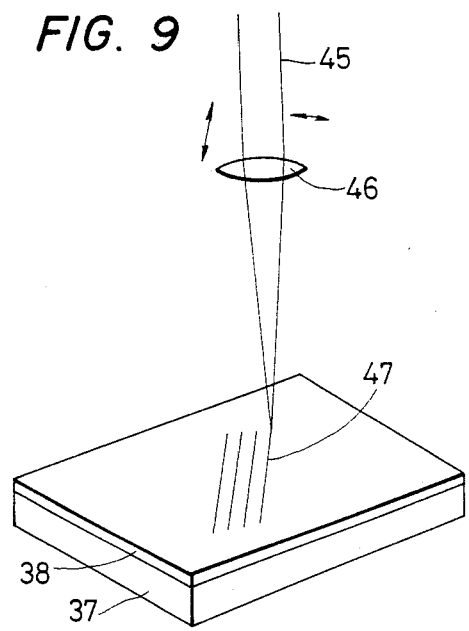
FIG. 9 is a schematic diagram of an optical system for the preparation of a diffraction grating by the light beam scanning method.

In the conventional system of FIG. 1, examples of sensitive materials 8 are a photoresist material and a thermoplastics material. When a photoresist is used as a light sensitive material, a beam of light of $\lambda$=4416 Å or 3250 Å from a He-Cd laser is often used as the coherent light since the photoresist shows the maximum sensitivity to light waves falling within the short wavelength region (blue to ultraviolet).

Each of the two beams of light is incident on the light sensitive material at an angle of $\theta$ relative to the normal m to the light sensitive material.

In this case, since changes in the intensity of light in a sine wave form are formed on the light sensitive material as a standing wave, there is formed an interference fringe having a clearance width of d. d is given by:

$$d=\lambda/(2\, n_0 \sin \theta) \tag{9}$$

where $n_0$ represents the refractive index of a medium through which light passes just before it is incident on the light sensitive material. In FIG. 1, since the medium is air, $n_0=1$.

Then, a holographic exposure is applied so as to form an interference fringe in which d is one-half of that of the formerly formed interference fringe. For this purpose, an attempt has heretofore been made to halve d by changing the angle of incidence $\theta$ in the equation (9). In accordance with the conventional procedure, however, positioning is difficult, and the origins X=0 of the two waves do not coincide.

The present invention as disclosed in the embodiment of FIGS. 18–22, inclusive, is intended to halve d by changing the refractive index n. The arrangement shown in FIGS. 18–21 is intended to be used in the arrangement of FIG. 1.

After the exposure of $b_1 \sin kx$ as shown in FIG. 1, a symmetrical transparent member 209 having a refractive index $n=2n_0$ is placed on the light sensitive material 8 as shown in FIG. 18 and, thereafter, the second exposure is applied thereon.

In the second exposure, the angles of faces KL and KM are determined so that the two beams of light are incident normally on the faces KL and KM. Therefore, the angle of incidence of each beam to the surface of the light sensitive material does not change. A triangle KLM is an isoceles triangle, and angle KLM=$\theta$ The clearance width $d_2$ of the interference fringe formed on the light sensitive material 8 by the second exposure is given by $$d_2=\lambda/(2n \sin \theta) \tag{10}$$

Since the refractive index n of the symmetrical transparent member 209 is twice $n_0$, $$d_2=d/2 \tag{11}$$

The ratio of amplitude $b_1$ to amplitude $b_2$ is given by the ratio of the first exposure energy to the second exposure energy. The ratio can be set at any desired value by controlling the exposure time. In this case, of course, it is necessary to take into consideration that at the second exposure the reflection of the beam incident on the symmetrical transparent member 209 and the attenuation in the inside of the transparent member 209 will occur.

In accordance with the present invention, as shown in FIG. 18, the light sensitive material is exposed to two kinds of interference fringes with wave numbers of k and 2k by changing the refractive index of a medium through which light passes just before it is incident on the light sensitive material.

It is significant in the invention that the origin x=0 coincides.

When in FIG. 1 the beams split by the beam splitter 2 travel along the left and right paths and are incident on the light sensitive material at an arbitrary point x, the origin is set at any suitable one of the points {x} at which the difference between the length of the left optical path Sl(x) and the length of the right optical path Sr(x) is the integral times the wavelength, $m\lambda+\lambda/4$. That is, the group of points {x} is given by $$Sl(x)-Sr(x)=m\lambda \pm \lambda/4 \tag{13}$$

where m represents an integer. Although the origin x=0 can be set at any one of the points, it is convenient to make a point, which satisfies the equation (13) and is near the center of the substrate, x=0.

Therefore, even at the second exposure, the lengths of the left and right optical paths, Tl(x) and Tr(x), can be defined and the group of points {x}' is determined by the equation:

$$Tl(x)-Tr(x)=M(\lambda/2)\pm \lambda/8 \tag{14}$$

where M is an integer.

Although the second point group $\{x\}'$ is present on the cross section of the light sensitive material at a density which is twice that of the first point group $\{x\}$, it is necessary that all elements in the first point group $\{x\}$ are contained in the second point group $\{x\}'$. That is, it is necessary that $$\{x\} \subset \{x\}' \tag{15}$$

The condition of the equation 15 is herein referred to merely by saying "it is necessary that the origin $x=0$ coincides". This is a severe condition.

The symmetrical transparent member 209 has an isoceles triangular cross section, and the middle point N of the bottom face LM should satisfy the equation (14).

FIG. 19 shows perspective views of a holder supporting a substrate, and of a symmetrical transparent member.

FIG. 20 is a cross sectional view illustrating the state in which the first exposure is applied, and FIG. 21 is a cross sectional view illustrating the state in which the second exposure is applied.

A holder 210 which is transparent and has isoceles triangular walls is used to support a substrate 7. The substrate 7 coated with a light sensitive material 8 is fitted through the holder 210 and held in position on the bottom portion of the holder 210. Between the holder 210 and the substrate 7 is a clearance 211 through which a symmetrical transparent member 209 is to be inserted.

At the first exposure, as shown in FIG. 20, the inserting clearance 211 is vacant. Thus, the two beams of light are incident on the light sensitive material at an angle of incidence $\theta$ through air. On the other hand, at the second exposure, as shown in FIG. 21, the symmetrical transparent member 209 is fitted through the clearance between the holder 210 and the substrate 7. The bottom angle of the transparent member 209 is $\theta(\Psi)$.

The two beams are incident normally on the holder 210. Then, they are incident normally on the two faces of the symmetrical transparent member 209. The refractive index n of the transparent member 209 is $2n_0$. Thus, in FIG. 21 the two beams, their wavelength being halved, travel through the transparent member 209 and are superposed on the light sensitive material, forming an interference fringe. The clearance width $d_2$ of the interference fringe is one-half of the clearance width d of the above-prepared interference fringe. The significant feature is that only by inserting the symmetrical transparent member, an optical arrangement for the second exposure is prepared; that is, it is not necessary to change the positions and directions of the substrate, and mirrors 5 and 6.

Therefore, in FIG. 21, the middle point of the bottom of the holder can be determined to satisfy the equation (14). By so doing, the origin coincides at the first and second exposures.

The symmetrical transparent member 209 is sufficient to have a refractive index which is twice the refractive index $n_0$ of air. To a beam of light having a wavelength of 4047 Å, heavy flint glass SF21 has a refractive index of $n=1.9997$. This glass, therefore, can be used to make the symmetrical transparent member 209.

In addition, a transparent liquid having a refractive index of $2n_0$ may be used to fill the clearance. That is, it is required for the symmetrical transparent member to be transparent and have a refractive index of $2n_0$, and therefore, the symmetrical transparent member may be solid or liquid.

In the above described embodiment, in order to produce a grating constant $d_2$, the beams are allowed to be incident on the light sensitive material through a medium having a refractive index which is twice that of air.

The present invention, however, is not limited to the use of a medium providing the the condition that $2n_0=n$.

In the above-described embodiment, as shown in FIGS. 18 and 21, the two beams are arranged so that they are incident normally on the faces of the symmetrical transparent member. Since they are incident normally, there is formed an interference fringe with a clearance width of $d_2=d/2$ under the condition that $2n_0=n$.

If, therefore, they are not incident normally, an interference fringe with a clearance width of $d_2=d/2$ is not formed even under the condition that $n=2n_0$.

More generally speaking, it is sufficient for the following equation to be satisfied:

$$n \sin \theta = 2n_0 \sin \theta \tag{16}$$

where $\theta$ and $n_0$ are an angle of incidence and a refractive index of a medium, respectively, at the first exposure, and $\theta$ and n are an angle of incidence and a refractive index of a medium at the second exposure.

Figure 22:
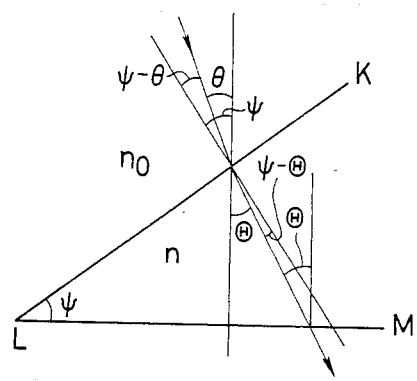
FIG. 22 is a schematic view showing the relations, e.g., the direction of reflection, of light incident on a symmetrical transparent member.

In the above-described embodiment, angle KLM of the symmetrical transparent member 209 is equal to the angle of incidence $\theta$. When angle KLM=$\Psi$, as illustrated in FIG. 22 the following equation is obtained on the basis of the condition that it is incident on the symmetrical transparent member 209.

$$n_0 \sin (\Psi-\theta) = n \sin (\Psi-\theta) \tag{17}$$

From the equations (16) and (17), an equation can be obtained concerning the relation between the angle $\Psi$ of the symmetrical transparent member and the refractive index n. Even if $n_0$ and $\theta$ are fixed, a combination can be obtained having a relatively high degree of freedom in respect to (n, $\Psi$).

From the equations (16) and (17) the following equation can be obtained showing the relation between $\Psi$ and n.

$$\left( \frac{\sin (\Psi + \theta)}{2 \sin \Psi} \right)^2 + \sin^2 \theta = \left( \frac{n}{2 n_0} \right)^2 \tag{18}$$

In the specific case where the bottom angle is equal to the angle of incidence $\theta$, $n=2n_0$.

When the bottom angle $\Psi$ is made larger than $\theta$, the ratio $n/n_0$ falls below 2, whereas when the bottom angle $\Psi$ is made smaller than $\theta$, the ratio $n/n_0$ becomes larger than 2.

In the above-described embodiment, since $\Psi=\theta$, it is necessary to use a substance (transparent) of $n=2$. Such substances are sometimes not present or are available only with difficulty. As described above, SFS 1 glass is transparent and has $n=1$ for a beam of light having a wave length of 4047 Å. To other laser wavelengths, there is not always a transparent substance of $n=2$.

Even in such cases, the present invention can be conducted according to equation (18).

In accordance with the present invention, a diffraction grating having a sawtooth-like cross section corresponding to a blazed diffraction grating can be prepared by a holographic exposure process. By inserting or taking out a symmetrical transparent member having an isosceles triangular cross section without changing the optical system, e.g., mirrors, exposure can be performed twice and, therefore, it is not difficult to achieve positioning.

Moreover, a laser source capable of producing beams of light having different wavelengths can be used.

Taking the wavelength into consideration in order to produce a clearance width d/2 in the interference fringe by the second exposure, it is sufficient that the following equation is satisfied in place of equation (16).

$$\frac{n \sin \theta}{2} = \frac{2 n_0 \sin}{\lambda} \quad (19)$$

where $\lambda$ is a laser light wavelength at the first exposure, and $\lambda_2$ is a laser light wavelength at the second exposure.

Equation (18) is rewritten:

$$\left(\frac{\sin (\Psi + \theta)}{\sin \Psi}\right) + \sin^2 \theta = \left(\frac{n\lambda}{2 n_0 \lambda_2}\right) \quad (20)$$

where $\Psi$ represents the bottom angle of the symmetrical transparent member, $\theta$ represents the angle of incidence, $n_0$ and $n$ each represents a refractive index, and $\lambda$ and $\lambda_2$ each represent a wavelength.

For example, even whan a laser light is incident normally on the symmetrical transparent member; i.e., $\Psi = \theta$, it is sufficient that $$\frac{n\lambda}{2 n_0 \lambda_2} = 1 \quad (21)$$

Thus, the severe condition of $n = 2n_0$ can be moderated by making the wavelength variable.

The equation (20) includes a specific example in which $n = n_0$, $\lambda_2$ and $\theta = \Psi$. In this case, the adjustment of the wavelength is employed as a means of preparing an interference fringe of d/2.

The diffraction grating thus-prepared has various uses, for example, (1) a diffraction grating for spectral analyzers, and (2) a diffraction grating for use in branching devices for optical communication.

Some kinds of electro-optic crystals, amorphous semiconductors, and thermoplastic materials are capable of changing their refractive indexes upon application of an electric field. This change in refractive index is reversible and returns to the original state on application of heat, for example. Thus, they can be used repeatedly.

$Bi_{12}SiO_{20}$(bismuth siliconoxide, hereinafter referred to as "BSO") and $Bi_{12}GeO_{20}$ (bismuth germanium oxide, hereinafter referred to as "BGO") monocrystals exhibit the electro-optic effect in the state that a DC voltage is applied in a certain direction, and when irradiated with light, cause a refractive index change depending on the light. If a DC electric field is not applied, they show no light sensitivity.

When the BSO and BGO monocrystals are irradiated with light in the condition that a DC electric field is applied, their refractive indexes change. This refractive index change is memorized for a relatively long period of time when the monocrystals are placed in a dark condition. If, however, the monocrystals are again irradiated with light, the previously formed refractive index change is erased, and a new refractive index change is caused depending on the intensity of light which is newly applied.

On irradiation of amorphous semiconductors made mainly of Se and S (chalcogenide glass) with light, a refractive index change also occurs depending on the electric field of the light. Therefore, it is possible to write a diffraction grating on such amorphous semiconductors by an optical procedure. The thus-written refractive index distribution can be erased by heating.

It is known that when thermoplastic elements are used in combination with photoconductive materials, they act as light recording elements having reversibility.

FIGS. 28–32 are cross sectional views of a thermoplastic element illustrating its optical recording process.

Thermoplastic materials soften on application of heat, showing plasticity and solidify when cooled.

Figure 28:
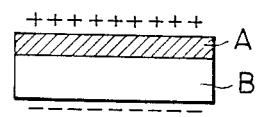
FIG. 28 is a cross sectional view of an optical branching filter element comprising a photoconductive material and a thermoplastic material, illustrating it in a charged condtion.

FIG. 28 shows a thermoplastic element comprised of a thermoplastic material A with a photoconductive material B provided on the back surface thereof which is charged by a corona discharge.

Figure 29:
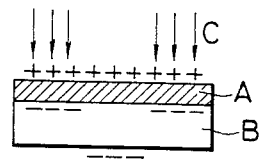
FIG. 29 is a cross sectional view of the optical branching filter element of FIG. 28, illustrating the condition where the charged optical branching filter element is exposed to light.

FIG. 29 shows the thermoplastic element upon exposure to light C. In this exposure step, the photoconductive material B becomes a conductor at areas where it is exposed to light C and negative charges move to the back surface of the thermoplastic material A.

Figure 30:
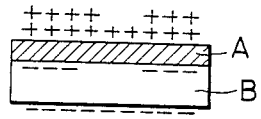
FIG. 30 is a cross sectional view of the optical branching filter element of FIG. 28, illustrating the condition where the optical branching filter member is again charged.

FIG. 30 shows a recharging step. Positive and negative electric charges are added to the surface of the thermoplastic material A and the back surface of the photoconductive material B. When the thermoplastic element is heated in that condition the thermoplastic material softens. Positive and negative electric charges on the front and back surfaces of the thermoplastic material A interact, causing an electrostatic force, as a result of which the thermoplastic material is subjected to a plastic deformation.

Figure 31:
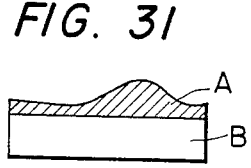
FIG. 31 is a cross sectional view of the optical branching filter element of FIG. 28 illustrating the condition where heat development is applied to form a diffraction grating.

FIG. 31 shows the thermoplastic element in a heat-developed condition. On the surface of the thermoplastic material irregularities are formed depending on the intensity of light irradiated. When the thermoplastic element is cooled, the irregularities are held.

Figure 32:
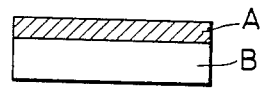
FIG. 32 is a cross sectional view of the optical branching filter element of FIG. 28 illustrating the condition where the diffraction grating is erased by heating.

When the thermoplastic element is heated again, it recovers its original layer form having a uniform thickness, as shown in FIG. 32.

The use of such optical recording elements which can be written on and erased permits the production of optical branching filter elements which make it possible to freely chose the wavelength of light.

Figure 23:
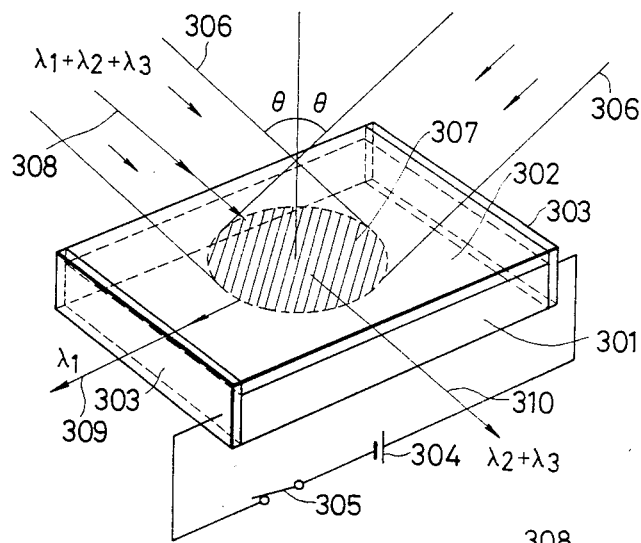
FIG. 23 is a perspective view of an optical branching filter element of the invention, illustrating the condition where a diffraction grating is formed on a waveguide made of an electro-optical material according to the holographic method.

FIG. 23 is a perspective view of an optical branching filter element of the invention in which an electro-optic crystal is used as a waveguide.

On a substrate 301 is formed a waveguide 302 made of an electro-optic material, such as BSO and BGO monocrystals as described hereinbefore. Both end surfaces of each of the substrate 301 and the wavelength 302 are provided with transparent electrodes 303 and 303 by a technique, such as vacuum deposition. The transparent electrode 303 is made of e.g., Au and $In_2O_3$. A DC voltage is applied across the transparent electrodes 303 and 303 by closing a switch 305 connected to a DC electric source 304. The BSO and BGO elements show the electro-optic effect only when a DC electric field is applied, and do not exhibit light-sensitivity when a DC electric field is not applied.

Two beams of light from the same laser are increased in radius and are incident on the waveguide 302 at the same angle of incidence $\theta$. This is an exposure process according to the two beam interference method which has already been described. The period of an interference fringe formed by irradiating with two beams can be given by equation (1) where $\lambda$ is a wavelength of a laser beam for exposure.

When the switch 305 is closed, i.e., a DC electric field is applied on the waveguide 302, the irradiation of the waveguide 302 with two beams causes changes in the refractive index of the waveguide 302 corresponding to the interference fringe. Since these changes in refractive index are correspondent to the equidistant parallel interference fringe, they serve as a diffraction grating 307.

Therefore, only a beam of light having a wavelength of $\lambda_1$, which satisfies the equation as described below, is diffracted.

$$m\lambda_1 = 2n \, d \cos \phi \tag{22}$$

where d is a grating constant of the diffraction grating, $\phi$ is an angle of incidence of a waveguide light 308, which is defined as an angle between a line normal to the grating lines of the diffraction grating 307 and the optic axis of the waveguide light, n is a refractive index of the waveguide to the waveguide light, and m is an integer showing the order of diffraction.

The waveguide light 308 contains beams of light having wavelengths of $\lambda_1$, $\lambda_2$, and $\lambda_3$. When it is only the beam of light having a wavelength of $\lambda_1$ of the beams that satisfies the equation (22), the beam of light of wavelength $\lambda_1$ alone is diffracted. In the embodiment shown in FIG. 23, the beam of light is taken out as a diffracted light 309 from the surface of the transparent electrode 303. The remaining beams of light of wavelengths $\lambda_1$ and $\lambda_2$ are not diffracted because they do not satisfy equation (22), and travel straight through the diffraction grating 307.

In this way, of a waveguide light containing beams of light having wavelengths $\lambda_1$, $\lambda_2$, and $\lambda_3$, the one having a wavelength of $\lambda_1$ can be branch filtered.

If it is desired to change the wavelength of $\lambda_1$ of the diffracted light, it is sufficient to change the grating constant d of the diffraction grating 307. For this purpose, it is preferred that the angle of incidence $\theta$ of beams 306 and 306 for exposure is changed, or the wavelength of the laser for exposure is changed.

When the beam of light having a wavelength $\lambda_2$ now satisifies equation (22) by changing $\phi$ or $\lambda$, it is now possible to branch filter only the one having a wavelength of $\lambda_2$ of the waveguide light containing the beams of light having wavelengths of $\lambda_1$, $\lambda_2$, and $\lambda_3$.

By arranging so that only a beam of light having a predetermined wavelength satisfies equation (22) by changing $\phi$ and $\lambda$ in the condition that a DC electric field is applied, it is possible to take out only the beam having the predetermined length.

The diffraction grating 307 is recorded as such and remains on the waveguide 302 as long as a DC electric field is continued to be applied, even if the irradiation of the beams 306 and 306 for exposure is stopped at the same time. The wavelengths $\lambda_1 + \lambda_2 + \lambda_3 + \ldots$ of the waveguide light are usually longer than the wavelength of the laser for exposure, and its electroptic effect is small. Thus, it is designed so that the diffraction grating 307 is not erased by the waveguide light.

However, even when a DC electric field is continued to be applied, if any one of the two beams is cut and only one beam of light is incident on the waveguide 302, the diffraction grating 307 disappears. The reason for this is that since only one beam of light is incident, no interference occurs, and a standing wave due to two beams is not formed on the waveguide 302.

Also, by removing the DC electric field, it is possible to make the diffraction grating 307 disappear.

Figure 24:
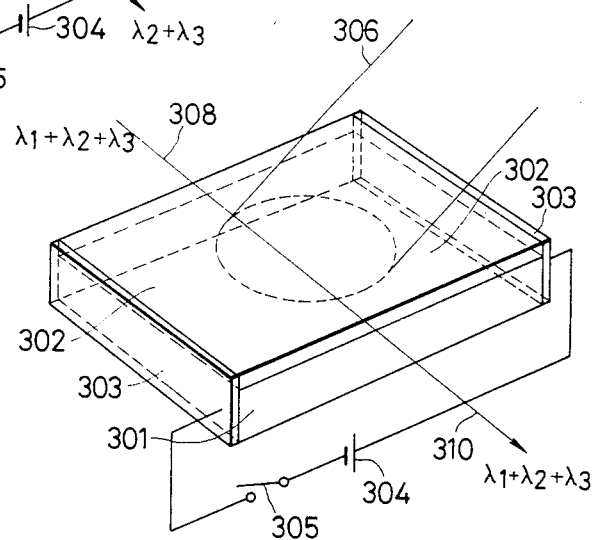
FIG. 24 is a perspective view of the optical branching filter element of FIG. 23, illustrating the condition where one of the beams is removed and the diffraction grating is erased.

FIG. 24 is a perspective view illustrating the condition in which the diffraction grating has disappeared.

When the switch 305 is opened and an electric field is not applied, or only one of the beams is irradiated, no diffraction grating exists. Thus, the waveguide light 308 is transmitted therethrough, and the diffraction grating does not have a branch filtering function.

Furthermore, since the diffraction grating can be formed or made to disappear momentarily, it is possible to use the diffraction grating as an optical switch for a diffracted light having a wavelength of $\lambda_1$.

Figure 25:
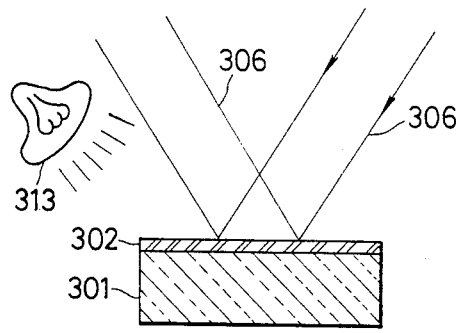
FIG. 25 is a cross sectional view illustrating the structure where a diffraction grating is formed on a waveguide made of an amorphous semiconductor by the two beam interference method, and it is erased by irradiation with an infrared lamp.

Amorphous semiconductors (chalcogenide glass) can also be used in the preparation of the waveguide 302. (1) As-S based, (2) As-S-Ce based, and (3) As-S-Se-Ge based chalcogenide amorphous semiconductors have the electro-optic effect, which can be used to reversibly prepare a diffraction grating in the same manner as described above. The preparation of such a diffraction grating can be achieved by the two beam interference method and the light beam scanning method as in the conventional method of preparation of irreversible waveguide type diffraction gratings. On application of light, changes in refractive index occur, resulting in the formation of a diffraction grating. This is memorized, but can be erased by heating. As shown in FIG. 25, the diffraction grating formed on the waveguide 302 made of an amorphous semiconductor is erased by uniformly irradiating it with light by the use of an infrared lamp 313.

Figure 26:
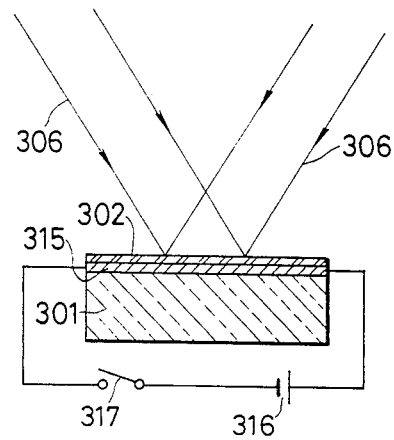
FIG. 26 is a cross sectional view illustrating the structure where a diffraction grating is formed on a waveguide made of an amorphous semiconductor by the two beam interference method and is heat erased by passing electricity through a resistor.

FIG. 26 shows another erasing process in which Joule's heat is utilized. Referring to FIG. 26, a resistor layer 315 is provided between a substrate 301 and an amorphous semiconductor waveguide, and when an electric current is passed through the resistor layer 314, Joule's heat is generated, and the diffraction grating formed is erased. The resistor layer 315 is connected to an electric source 316 and a switch 317.

In addition, thermoplastic materials can be used in the preparation of waveguides. As has already been explained, these thermoplastic materials soften on heating, producing plasticity, and solidify on cooling. They do not have the electro-optic effect, and do not produce a refractive index distribution on application of light waves. However, when they are used in combination with photoconductive elements, and are charged and exposed to light, irregularities are formed in the surface of the thermoplastic material depending on the intensity of light energy. Thus, there can be formed a diffraction grating. Such diffraction gratings can be formed by the holographic method or light beam scanning method as in the above-described two processes.

Figure 27:
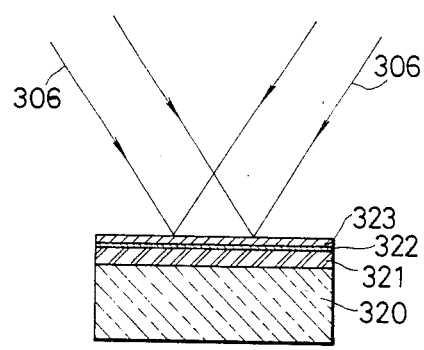
FIG. 27 is a cross sectional view of an optical branching filter element of the invention, which is prepared using a thermoplastic material.

FIG. 27 shows a cross sectional view of an optical branching filter element using a thermoplastic material. On a substrate 320 is formed a semiconductor waveguide 321 through which light is conducted. On the waveguide 321, a photoconductive thin film layer 322 and a thermoplastic material layer 323 are superposed.

An electrode for corona discharge is provided above the optical branching filter element. The member is treated according to a process comprising the steps, such as charging, exposure, recharging, and heating, as shown in FIGS. 28–32. For heating, Joule's heat may be generated by passing a current through the waveguide 321.

In accordance with the invention, a reversible optical branching filter element can be produced using a diffraction grating which can be formed and erased by application of light.

In the optical wavelength division multiplex communication system, the optical branching filter element of the invention has many uses because the wavelength of light to be chosen can be changed. Furthermore, since the diffraction grating can be erased or formed momentarily, it can be used as an optical switching element.

The intermediate mark and focusing lens combination used in the systems of FIGS. 10a and 10b may be used for the same purpose in the system discussed with respect to the embodiments of FIGS. 18–22. Likewise, the exposure system utilized in the formation of a diffraction grating in the optical branching filter element disclosed in FIGS. 23–32 may incorporate various features of the disclosed exposure systems.

While the invention has been particularly shown and described with reference to preferred embodiments thereof, it will be understood by those in the art that the foregoing and other changes in form and details may be made therein without departing from the spirit and scope of the invention.

What is claimed is:

1. In a method for forming a diffraction grating by a holographic exposure process which includes the steps of splitting a laser beam into two collimated light beams having an increased beam radius and reflecting said beams onto a substrate coated with light sensitive material, the improvement comprising placing a photomask having a transparent area on said light sensitive material at a location corresponding to the desired location of a diffraction grating and passing one of said beams through an intermediate mask having a narrow opening to limit the light flux of said one of said beams to the area where the diffraction grating is to be formed.

2. A method as set forth in claim 1 further comprising passing said one of said beams through a lens subsequent to passage through said opening in said intermediate mask to focus the image of said opening on said light sensitive material.

3. A method as set forth in claim 2 further comprising passing the other of said light beams through an opening in an intermediate mask and focusing lens prior to impingement upon said light sensitive material.

4. A method as set forth in claim 1 further comprising subjecting said light sensitive material to two exposures such that in a first exposure the two beams are incident on the light sensitive material through air to form an interference fringe having a clearance width d and such that in a second exposure, without changing the angle of each beam and the position of the light sensitive material, a symmetrical transparent member having an isoceles triangular cross section is placed in such a manner that the origin coincides and the two beams are irradiated through the symmetrical transparent member to form an interference fringe having a clearance width d/2 and the ratio of the first exposure energy to the second exposure energy is made equal to the ratio of the first term to the second term of a Fourier series obtained by expanding the periodical function of the wave form of a blazed diffraction grating.

5. The method as claimed in claim 4, wherein the interference fringe having a clearance width of d/2 is prepared by arranging the two beams so that the following equation is satisfied:

$$\left(\frac{\sin(\Psi+\theta)}{2\sin\Psi}\right)^2 + \sin^2\theta = \left(\frac{n}{2n_0}\right)^2$$

where $\theta$ is an angle of incidence of each beam to the light sensitive material at the first exposure, $n_0$ is a refractive index of air, $\Psi$ is the bottom angle of the symmetrical transparent member, and n is a refractive index of the symmetrical transparent member.

6. The method as claimed in claim 5 wherein the refractive index n is made equal to $2n_0$ by making the bottom angle $\Psi$ of the symmetrical transparent member equal to the angle of incidence $\theta$.

7. The method as claimed in claim 4, wherein the interference fringe having a clearance width of d/2 is prepared by arranging the two beams so that the following equation is satisfied:

$$\left(\frac{\sin(\Psi+\theta)}{2\sin\Psi}\right)^2 + \sin^2\theta = \left(\frac{n\lambda}{2n_0\lambda_2}\right)^2$$

where $\lambda$ is the wavelength of a laser beam at the first exposure, $\theta$ is an angle of incidence of each beam on the light sensitive material, $n_0$ is refractive index of air, $\Psi$ is a bottom angle of the symmetrical transparent member, and $\lambda_2$ is a wavelength of the laser beam.

8. The method as claimed in claim 7, wherein $\lambda_2 = \lambda/2$.

* * * * *